United States Patent [19]
Plaettner

[11] Patent Number: 4,948,740
[45] Date of Patent: Aug. 14, 1990

[54] METHOD FOR THE INTEGRATED SERIES-INTERCONNECTION OF THICK-FILM SOLAR CELLS AND METHOD FOR THE MANUFACTURE OF TANDEM SOLAR CELLS

[75] Inventor: Rolf Plaettner, Riemerling, Fed. Rep. of Germany

[73] Assignee: Siemens Aktiengesellschaft, Berlin and Munich, Fed. Rep. of Germany

[21] Appl. No.: 323,867

[22] Filed: Mar. 15, 1989

[30] Foreign Application Priority Data

Mar. 24, 1988 [DE] Fed. Rep. of Germany ....... 3810026

[51] Int. Cl.$^5$ .......................................... H01L 31/18
[52] U.S. Cl. .................................... 437/4; 437/2; 136/244; 136/249; 136/258
[58] Field of Search ........................ 437/2–5; 136/258 PC, 249 TJ, 244

[56] References Cited

U.S. PATENT DOCUMENTS

| 4,243,432 | 1/1981 | Jordan et al. | 136/244 |
| 4,313,022 | 1/1982 | Jordan et al. | 136/244 |
| 4,847,669 | 7/1989 | Yamazaki | 357/30 |

FOREIGN PATENT DOCUMENTS

| 0193820 | 9/1986 | European Pat. Off. | 437/2 |
| 0232749A2 | 8/1987 | European Pat. Off. | 136/244 |
| 59-25279 | 2/1984 | Japan | 136/244 |
| 59-220977 | 12/1984 | Japan | 437/4 |

OTHER PUBLICATIONS

Morel et al., *Energy-Based Performance and Evaluation of Thin Film Si:H/Copper Indium Diselenide Tandem Solar Cells and Modules,* Proceedings of the 18th Photovoltaic Specialists Conference (1985), pp. 876–882.

W. Juergens et al, *Economical Patterning of Series Connected a-Silicon Modules,* Proceedings of the 7th E.C. Photovoltaic Solar Energy Conference, Oct. 1986, pp. 494–503.

*Primary Examiner*—Aaron Weisstuch
*Attorney, Agent, or Firm*—Hill, Van Santen, Steadman & Simpson

[57] ABSTRACT

A method is provided for the series-interconnection of a plurality of thick-film solar cells. Separating grooves in the thick-film semiconductor layer necessary for forming conductive connections between the cells are produced through a lift-off technique. The stripe pattern needed for the lift-off technique is applied onto a substrate having structured base electrodes. The stripe pattern is applied thereto as a paste in a silk-screening method before the surface-wide deposition of the thick-film semiconductor and is removed before the deposition of the cover electrode layer. Involved mechanical parting methods are avoided through the method of the present invention. According to an embodiment of the present invention, a polycrystalline silicon layer can be used as a thick-film and the solar cell manufactured therewith can be combined via an optional coupler with a solar cell based on amorphous, hydrogenated silicon (a-Si:H), whereby an a-Si:H cell comprising two transparent electrodes can be wired as the front cell. The method is cost-beneficial because it can be easily automated and allows a high throughput.

10 Claims, 2 Drawing Sheets

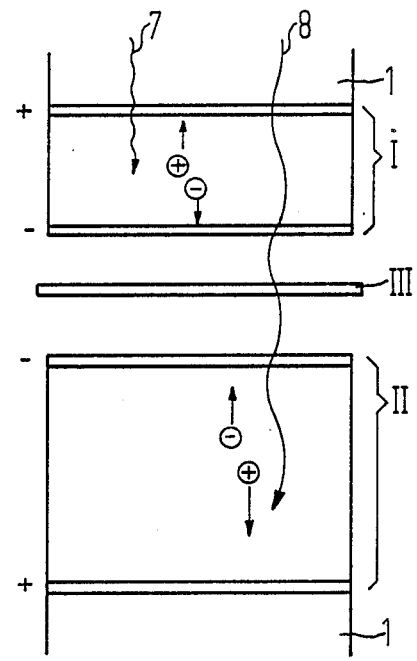
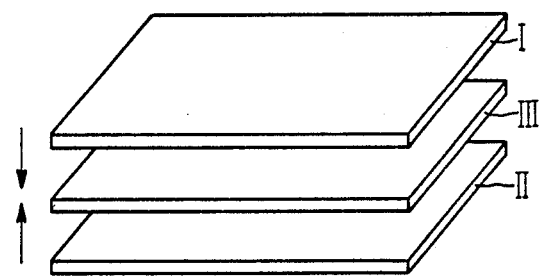

METHOD FOR THE INTEGRATED SERIES-INTERCONNECTION OF THICK-FILM SOLAR CELLS AND METHOD FOR THE MANUFACTURE OF TANDEM SOLAR CELLS

BACKGROUND OF THE INVENTION

The present invention is directed to a method for the integrated series-interconnection of a plurality of thick-film solar cells located on an insulating transparent substrate.

Due to a relatively high current that is generated, of approximately 40 mA/cm$_2$, solar cells constructed from crystalline silicon in the form of small surfaces of about 1 dm$_2$ must be interconnected to one another, in order to avoid current losses. This is true of crystal wafers of single-crystal silicon whose sizes are limited by the method of growing the crystal.

It is possible to obtain larger surfaces of polycrystalline silicon. For example, these larger surfaces of polycrystalline silicon can be produced through a ribbon-drawing method. The larger surface polycrystalline silicon is sawn into wafers having a size of approximately 10 cm×10 cm, and subsequently soldered together, again in a serial fashion, with small metal bands. Although current losses can thereby be adequately avoided; the process, however, is involved and expensive.

A further drawback of crystalline silicon is that its low energy gap of $E_g = 1.1$ eV, is poorly suited for a solar spectrum having an intensity maximum at 1.45 eV. It would therefore be desirable if the low energy gap could be combined, in a tandem cell, with an energy gap lying sufficiently above 1.45 eV.

Such a possibility is established, for example, by the combination of polycrystalline silicon ($E_g$ 1.1 eV) with amorphous silicon ($E_g$ 1.75 eV). Silicon is a material that is neither affected by resource problems nor by environmental problems and therefore could be used as a semiconductor material in both sub-cells.

Referring to FIGS. 7 and 8, the structure and function of a tandem cell is illustrated. I denotes an upper solar cell of amorphous, hydrogenated silicon having an energy gap of $E_{g1}$. II denotes a lower solar cell of polycrystalline silicon having an energy gap $E_{g2}$ ($E_{g1}$ greater than $E_{g2}$). III denotes an optical coupler. A glass substrate 1 is indicated by reference numeral 1. The penetration depth of short-wave light is indicated by arrow 7. The penetration depth of long-wave light is indicated by arrow 8.

Amorphous silicon in the form of hydrogenated a-Si:H has an energy gap of, typically, 1.75 eV. The energy gap can be shifted somewhat (1.7 through 1.8 eV) by variations in the manufacturing conditions. As may be derived from a report by D. Morel et al in the *Proceeding of the* 18th Photovoltaic Specialists Conference (1985), pages 876 through 882, there are solar cells of amorphous silicon, even in an embodiment necessary for front cells comprising two transparent electrodes.

The silicon in an a-Si:H solar cell has a layer thickness of less than 0.5 μm. The energy gap of the amorphous silicon in these cells can be somewhat increased by adding carbon. However, the layer thickness of the polycrystalline silicon needed for the lower sub-cell, by contrast, is 20 through 30 μm (thick-film cell). The sunlight is then adequately absorbed.

Due to cost considerations, preferably, the technology that should be utilized to manufacture polycrystalline silicon thick films is technology that is analogous to thin-film technology. What is critical is that these sub-cells are manufactured so that they have an adequately smooth surface without requiring involved mechanical re-working. This allows them to be subsequently bonded to an a-Si:H cell through a simple laminating process. A significant advantage of thin-film solar cells is that by dividing them into narrow strips, they can be series-interconnected. This results in modules having a higher voltage and low current.

The series-interconnection of the thick-film cells in small surface units (strips cells) is also desirable in order to manage the low current losses in this part of the tandem solar cell. The series-interconnection in small surface units is likewise desirable in order to make the voltage of the modules variable based on external requirements. Heretofore, this has not been possible in an economic manner.

U.S. Pat. No. 4,745,078 discloses a method for thin-film solar cells wherein separating grooves are produced, for interconnection, in a thin-film applied to a substrate provided with front electrodes. A stripe pattern of, preferably, plastic is applied before the application of a metal electrode layer for providing series interconnections. Separating grooves are then produced, mechanically, next to the stripe pattern. The grooves are then filled with metal. The metal electrode layer is then deposited and, subsequently, the stripe pattern is again removed through a lift-off technique, whereby a metal electrode series interconnection structure is formed.

Another method for manufacturing series-interconnected modules of crystalline silicon, utilizing a mechanical separation, is proposed in German Patent Application No. P 37 27 825.8. In this method, narrow ridges that have already been provided on the substrate by selectively removing material from a glass substrate, are used for defining the stripe-shaped individual solar cells. The front electrodes are produced through a silk-screening method, and then the series-interconnection is formed via grooves in the rear contact.

Both of the methods, particularly the latter (due to the co-coating of the ridges), have the great disadvantage that they require involved etching and grinding processes. Moreover, a damage layer, that is high in defects, arises during the grinding process, and must be eliminated through an additional etching process. The methods, in addition to resulting in higher costs, have the drawback that due to the grinding process, edge eruptions in the layer are produced. Overall, such methods are not adapted to thin-film technology.

SUMMARY OF THE INVENTION

The present invention provides a method for forming thick-film solar cells that is adapted to the thin-film technique and which does not exhibit the disadvantages set forth above and with which sub-cells of polycrystalline silicon can be manufactured and combined with cells of amorphous, hydrogenated silicon in the course of being processed into tandem solar cells.

To this end, the present invention provides a method for the integrated series-interconnection of a plurality of thick-film solar cells arranged on an insulating transparent substrate. The method comprises the steps of applying a stripe pattern onto a structured base electrode as a paste in a silk-screening method, before the deposition of a thick-film. The pattern is applied such that it covers an edge lying in a direction toward the neighboring cell provided for series interconnection. A thick-film is then deposited surface-wide. The stripe pattern is then removed through a lift-off technique, whereby a selective division or segmentation of the thick-film ensues. A cover electrode is then applied surface-wide and structured.

In an embodiment of the method, a thick-film of polycrystalline silicon is utilized.

In an embodiment of the method, a silk-screening paste is utilized that contains porous and/or relatively coarse-grained filler material.

In an embodiment of the method, both the base electrode and the cover electrode are structured through a silk-screening method.

In an embodiment of the method, a metallic electrode is utilized as the base electrode and a transparent electrode is utilized as the cover electrode.

The method of the present invention can be utilized to manufacture tandem solar cells. In an embodiment, the tandem solar cells are each composed of at least a solar cell based on amorphous, hydrogenated silicon layer (a-Si:H) as an active layer, a solar cell based on crystalline silicon as an active layer, and of a laminated, optical coupler. The a-Si:H cell, which includes two transparent electrodes, is wired as a front cell (light incidence side).

Additional features and advantages of the present invention will be apparent from the detailed description of the presently preferred embodiments and from the drawings.

BRIEF DESCRIPTION OF THE DRAWINGS

FIG. 7 illustrates the structure and the function of a tandem cell that can be created by the method of the present invention.

FIG. 8 illustrates a perspective view of the component parts of a tandem cell according to FIG. 7.

DETAILED DESCRIPTION OF THE PRESENTLY PREFERRED EMBODIMENTS

The present invention provides a process sequence for forming thick-film solar cells adapted to the use of thin-film techniques that does not exhibit the disadvantages set forth previously, and with which it is possible, in a simple manner, to particularly manufacture sub-cells composed of polycrystalline silicon and to combine these with cells of amorphous, hydrogenated silicon in the course of further processing into tandem solar cells.

To this end, the present invention provides a method that includes the following steps: applying a stripe pattern onto a structured base electrode as a paste via a silk-screening method before the deposition of a thick-film, the stripe pattern being applied such that it covers an electrode edge lying in a direction toward the neighboring cell provided for series interconnection; a thick-film semiconductor layer is then deposited surface-wide; the stripe pattern is removed by a lift-off technique; and a cover electrode is applied surface-wide and structured.

In an embodiment of the method of the present invention, a thick-film of polycrystalline silicon is utilized. The manufactured film can have a large-area and may be formed by various methods such as, for example, deposition from a vapor phase after thermal decomposition of a gaseous compound containing silicon, by deposition in a glow discharge plasma, by vapor-deposition, or by cathode sputtering.

Figure 1:
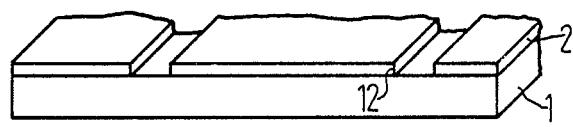
FIG. 1 illustrates a cross-sectional perspective view of a step of the method of the present invention.

Referring now to the figures, FIGS. 1–6 illustrate steps in the method of the present invention. Referring specifically to FIG. 1, in the embodiment of the present invention illustrated, the solar cell is constructed proceeding from the metal electrode side. It is also possible to perform the structuring in a reverse sequence proceeding from the transparent electrode side.

To this end, a layer composed of metal (for example, aluminum) is applied, in a large-area manner, onto a substrate 1 composed of glass. The metal is then structured, through a silk-screening method so that an electrode structure 2 arises.

Figure 2:
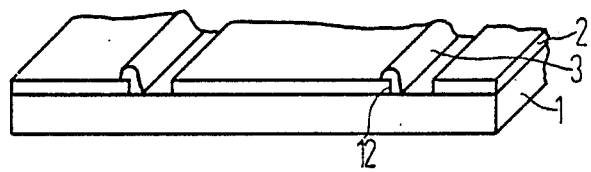
FIG. 2 illustrates a cross-sectional perspective view of another step of the method of the present invention.

Referring now to FIG. 2, a stripe pattern, lines 3, is applied. The stripe pattern is applied through a silk-screening method by means of a paste. The paste can be composed of, for example, plexigum having a filler composed of, for example, limestone powder. The paste is applied such that the stripes cover an edge 12 of the electrode layer 2 lying in a direction toward the neighboring cell provided for the interconnection. Preferably, the filler material in the silk-screening paste is porous and constructed of a relatively coarse-grained material. This allows the bath fluid to easily penetrate into the stripes during the later removal of the stripes.

Figure 3:
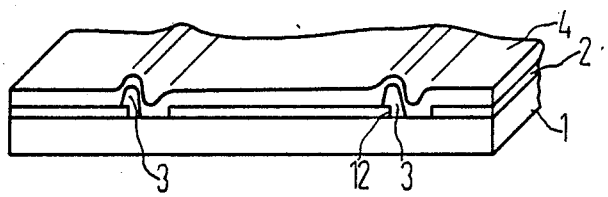
FIG. 3 illustrates a cross-sectional perspective view of another step of the method of the present invention.

Referring now to FIG. 3, after the paste lines 3 are dried, a polycrystalline silicon layer 4 is applied thereto. The polycrystalline silicon layer 4 is applied surface-wide by deposition from the vapor phase or by sputtering. In this regard, it has been found that plasma CVD (chemical vapor deposition) methods of the decomposition of gaseous silicon compounds such as, for example, silane, are especially suitable. It is important that the process for the manufacture of the polycrystalline silicon layer utilizes temperatures below the softening point (temperature) of the substrate glass.

In order to achieve high efficiency solar cells, it is necessary that the size of the crystallites is in the millimeter range. Due to the plasma deposition method, the silicon species are highly excited and the radicals thereby produced exhibit a high lateral mobility on the substrate surface. A polycrystalline silicon layer that does not have an excessively small crystallite size arises. A further grain enlargement can be achieved by recrystallization. The remaining grain boundary influences can also be reduced by methods such as, for example, passivation with hydrogen.

Figure 4:
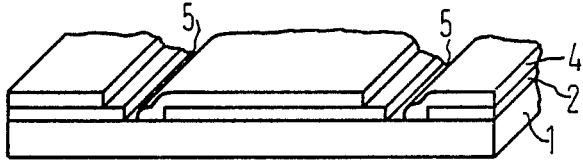
FIG. 4 illustrates a cross-sectional perspective view of another step of the method of the present invention.

Referring now to FIG. 4, the stripe pattern 3 is removed by treatment in an ultrasound bath in a solvent that dissolves or eliminates the paste. Examples of such solvents are acetone and alcohol. The regions of the polycrystalline silicon layer 4 lying over these paste lines 3 are also lifted off via the lift-off technique and, thus, a selective division of the thick-film silicon layer 4 ensues without the use of a mechanical separating method. Separating grooves 5 arise that extend downwards as far as the glass substrate 1.

Figure 5:
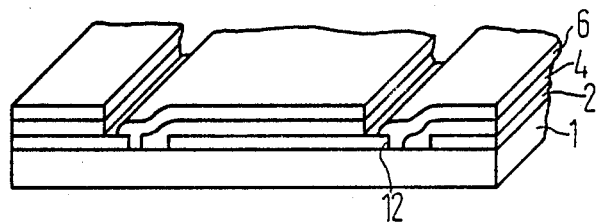
FIG. 5 illustrates a cross-sectional perspective view of another step of the method of the present invention.

Referring now to FIG. 5, a layer composed of a transparent material, for example, of doped zinc or tin oxide is applied surface-wide onto the arrangement (1, 2, 4) having the separating grooves 5. The layer of transparent material is then structured via a silk-screening method so that the discrete front electrodes 6 are formed. The parting trench 5, in the region of the glass substrate 1, is filled with material.

Figure 6:
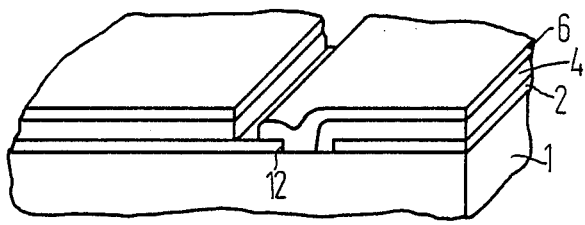
FIG. 6 illustrates a detailed, enlarged view of a portion of FIG. 5.

FIG. 6 illustrates, in detail, the series-interconnection. The same reference characters as in FIG. 5 apply. In principle, a respective edge of an upper, transparent electrode 6 of one stripe cell is connected to an edge of a lower electrode 2 of a neighboring stripe cell. In this regard, the silk-screening masks for the three printing events (metal electrode, stripe pattern of paste, and transparent electrode) are shifted somewhat relative to one another. Alternatively, the structure of the electrodes can also be produced through a silk-screening method with material that can be lifted off.

As previously stated, the manufacture of the structured, polycrystalline silicon cell can be performed in two different executed sequences, dependent upon whether a metallic or transparent electrode is deposited first on the substrate. In both cases, however, the process provides five sub-process steps that provide a good throughput given a low investment, are easily automated, and are thus cost-beneficial. The method of the present invention also provides an advantage in that unstructured, smooth and, thus, cost-beneficial glass substrates can be used.

Referring now to FIG. 7, the structure and function of tandem cells, comprising four contacts is illustrated. These tandem cells can be created utilizing the method of the present invention. In FIG. 7, short-wave light irradiation is represented by an arrow bearing the reference numeral 7; and long-wave light irradiation is indicated by an arrow bearing the reference numeral 8.

Referring now to FIG. 8, the component parts necessary for constructing a tandem cell pursuant to the present invention are illustrated. Reference character I indicates an a-Si:H cell (thin-film cell). Reference character II indicates a polycrystalline silicon cell (thick-film cell) produced according to the method of the present invention. Reference character III indicates an optical coupler. The tandem cell is assembled based on a simple laminating process.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

I claim:

1. A method for the integrated series-interconnection of a plurality of thick-film solar cells arranged on an insulating, transparent substrate, comprising the sequential steps of:
   (a) applying a stripe pattern onto a pattern of spaced apart base electrodes formed on a substrate, as a paste, through a silk-screening method, before deposition of a thick-film semiconductor layer thereon, the stripe pattern being applied such that it covers an edge of each base electrode lying in a direction toward a neighboring base electrode;
   (b) depositing the thick-film semiconductor layer surface-wide;
   (c) removing the stripe pattern through a lift-off technique, thereby selectively dividing the thick-film into a plurality of segments corresponding to each of the spaced apart base electrodes; and
   (d) applying a cover electrode surface-wide and structuring same such that a series interconnection is formed between the base electrode of each cell and the cover electrode of the neighboring cell.

2. The method of claim 1 wherein the thick-film semiconductor layer comprises polycrystalline silicon.

3. The method of claim 2 including the further step of forming a tandem solar cell structure which comprises at least a solar cell based on amorphous, hydrogenated silicon layer (a-Si:H) as an active layer, a solar cell based on said polycrystalline silicon as an active layer, and an optical coupler laminated between the amorphous and polycrystalline cells.

4. The method of claim 3 wherein a said a-Si:H cell comprising two transparent electrodes is wired as a front side light incidence side cell.

5. The method of claim 1 wherein the silk-screening paste contains porous filler material.

6. The method of claim 5 wherein the silk-screening paste contains relatively coarse-grained filler material.

7. The method of claim 1 wherein both the base electrodes and the cover electrodes are patterned via a silk-screening method.

8. The method of claim 1 wherein the base electrode is a metallic electrode and the cover electrode is a transparent electrode.

9. A method for manufacturing tandem solar cells including the steps of creating integrated series-interconnected thick-film solar cells arranged on an insulating, transparent substrate, comprising the sequential steps of:
   (a) applying a stripe pattern onto a pattern of spaced apart base electrodes formed on a substrate, as a paste, through a silk-screening method, before deposition of a thick-film semiconductor layer thereon, the strip pattern being applied such that it covers an edge of each base electrode lying in a direction toward a neighboring base electrode;
   (b) depositing the thick-film polycrystalline silicon semiconductor layer surface-wide;
   (c) removing the stripe pattern through a lift-off technique, thereby selectively dividing the thick-film into a plurality of segments corresponding to each of the spaced apart base electrodes;
   (d) applying a cover electrode surface-wide and structuring same to create a resultant series interconnected thick-film solar cell; and
   (e) forming tandem solar cells wherein each tandem solar cell includes at least a solar cell based on amorphous, hydrogenated silicon layer (a-Si:H) as an active layer, the resultant thick-film solar cell based on polycrystalline silicon as an active layer, and an optical coupler laminated between the amorphous and polycrystalline solar cells.

10. The method of claim 9 wherein a said a-Si:H cell comprising two transparent electrodes is wired as a front side light incidence side cell.

* * * * *